United States Patent [19]

O'Hern et al.

[11] Patent Number: 5,791,358
[45] Date of Patent: Aug. 11, 1998

[54] RINSE TROUGH WITH IMPROVED FLOW

[75] Inventors: Timothy J. O'Hern; Thomas W. Grasser, both of Albuquerque, N. Mex.

[73] Assignee: Sandia Corporation, Albuquerque, N. Mex.

[21] Appl. No.: 752,101

[22] Filed: Nov. 20, 1996

[51] Int. Cl.⁶ .................................................. B08B 3/02
[52] U.S. Cl. ................................... 134/199; 134/902
[58] Field of Search ......................... 134/902, 199, 134/155, 156, 201, 95.3, 94.1, 184, 186, 198; 211/41, 41.18

[56] References Cited

U.S. PATENT DOCUMENTS

| | | | |
|---|---|---|---|
| 4,092,176 | 5/1978 | Kozai et al. | 134/199 |
| 4,126,419 | 11/1978 | Katabuchi et al. | 422/109 |
| 4,397,694 | 8/1983 | Maxelon | 134/151 |
| 4,519,846 | 5/1985 | Aigo | 134/199 |
| 4,541,141 | 9/1985 | Le Goff | 134/902 |
| 4,738,272 | 4/1988 | McConnell | 134/201 |
| 4,781,205 | 11/1988 | Shakley | 134/902 |
| 4,795,497 | 1/1989 | McConnel et al. | 134/18 |
| 4,871,417 | 10/1989 | Nishizawa et al. | 134/902 |
| 5,220,933 | 6/1993 | Albers | 134/170 |
| 5,261,431 | 11/1993 | Ueno et al. | 134/902 |
| 5,327,921 | 7/1994 | Mokuo et al. | 134/902 |
| 5,379,785 | 1/1995 | Ohmori et al. | 134/902 |
| 5,460,789 | 10/1995 | Wilhelm | 431/7 |
| 5,531,236 | 7/1996 | Kempka et al. | 134/182 |
| 5,562,442 | 10/1996 | Wilhelm | 431/5 |

FOREIGN PATENT DOCUMENTS

| | | | |
|---|---|---|---|
| 60-231330 | 11/1985 | Japan . | |
| 61-284927 | 12/1986 | Japan | 134/902 |
| 259523 | 11/1991 | Japan | 134/902 |
| 266431 | 11/1991 | Japan . | |
| 56321 | 2/1992 | Japan | 134/155 |
| 152522 | 5/1992 | Japan . | |
| 36662 | 2/1993 | Japan | 134/902 |
| 196468 | 7/1994 | Japan | 134/902 |

Primary Examiner—Amy B. Vanatta

[57] ABSTRACT

Novel rinse troughs accomplish thorough uniform rinsing. The troughs are suitable for one or more essentially planar objects having substantially the same shape. The troughs ensure that each surface is rinsed uniformly. The new troughs provide uniform rinse fluid flow over the objects' surfaces to accomplish a more thorough rinse than prior art troughs.

17 Claims, 4 Drawing Sheets

RINSE TROUGH WITH IMPROVED FLOW

This invention was made with Government support under Contract DE-AC04-94AL85000 awarded by the U.S. Department of Energy. The Government has certain rights in the invention.

BACKGROUND OF THE INVENTION

The present invention relates to the field of surface rinsing, and more specifically to the field of semiconductor wafer rinsing.

The removal of contaminants from surfaces is a common task. A common technique used to accomplish this removal is to rinse the surface with air, water, or some other fluid. Differing applications have different constraints on the type of rinsing fluid employed, the flows that are need to accomplish the rinse, and the thoroughness of rinse required.

The rinsing of essentially planar objects is a typical example of rinsing. In production environments, often many objects of similar size and shape must be rinsed. Examples of such environments include semiconductor wafer processing, photographic film processing, and certain precision machined parts. Semiconductor wafer processing poses a particular challenge: large numbers of wafers must be rinsed, the rinse must be very thorough, and the hazardous nature of the contaminants being removed imply that the rinse be accomplished with a minimum of fluid (since the waste fluid carries the contaminants).

Several techniques are currently employed in the rinsing of semiconductor wafers. McConnell, et. al. in U.S. Pat. No. 4,795,497 disclose a fluid treatment system that is kept hydraulically full. Processing fluids can be pumped through the system as well as rinsing fluids. This system proves cumbersome, however, for the rinsing of semiconductor wafers processed by other methods.

Another common method of rinsing semiconductors involves a rinse tank. The wafers are held in a rectangular trough, and the loaded trough is lowered into a tank of deionized water. This approach is straightforward in concept and in implementation, and is applicable in a variety of processing systems. Kase (Japan patent 266,431) and Kanamaru (Japan patent 152,522) disclose rinse troughs that can be used in a rinse tank system. Kanamaru discloses a trough where rinse fluid recirculates in the lower corners, reducing the rinse efficiency. Kanamaru attempts to improve the efficiency of the rinse trough by changing the shape of the floor of the trough. Kase discloses a trough with a single fluid inlet in the floor. This results in non-uniform fluid flow, yielding an inefficient rinse. Kase attempts to improve the fluid flow paths by allowing fluid in at multiple points in the trough; the configuration disclosed can still result in non-uniform fluid flow paths and consequently inefficient rinsing. More recently, Kempka (U.S. Pat. No. 5,531,236) discloses another rinse trough design. Kempka's design yields more efficient rinsing than those of Kase and Kanamaru, but can still result in non-uniform rinse fluid flow patterns.

Current rinse tank processing does not result in uniformly thorough contaminant removal from wafers. It also requires excessive quantities of costly deionized water, and results in equally excessive amounts of contaminated water. There is an unmet need for improvements to the rinse tank apparatus that uniformly remove contaminants from wafer surfaces and minimize the amount of rinse fluid used.

SUMMARY OF THE INVENTION

Removal of contaminants from the surface of an object depends strongly on the rinsing fluid's velocity field. The effectiveness of both mechanical and diffusive removal depends on the rinse fluid velocity field. Rinse fluid flow rates over the objects must be as uniform as possible to ensure that all surfaces are equally well rinsed.

In one embodiment of the invention floor injectors mounted with the floor of a trough inject rinse fluid into the trough. The floor injectors are angled away from each other so that the rinse fluid flows do not coalesce. The floor injector angles and flow rates can be chosen so that rinse fluid flow across the objects' surfaces is substantially uniform.

In another embodiment of the invention injectors are also mounted with the side walls of a trough. The side wall injectors direct fluid into the trough so that rinse fluid flow from the floor injectors does not cause recirculation or stagnation in the lower corners of the trough. This results in more uniform rinse fluid flow velocity over the object surfaces.

DESCRIPTION OF THE FIGURES

The accompanying drawings, which are incorporated into and form part of the specification, illustrate an embodiment of the invention and, together with the description, serve to explain the principles of the invention.

DETAILED DESCRIPTION OF THE INVENTION

Removal of contaminants from an object's surface depends strongly on the characteristics of the rinse fluid's flow velocity pattern. For even rinsing, the rinse fluid flow velocity pattern should be substantially even across the entire surface of the object. The present invention comprises a trough for holding objects, with means for injecting rinse fluid into the trough so that the rinse fluid flow velocity pattern is substantially even across the objects' surfaces.

Figure 1:
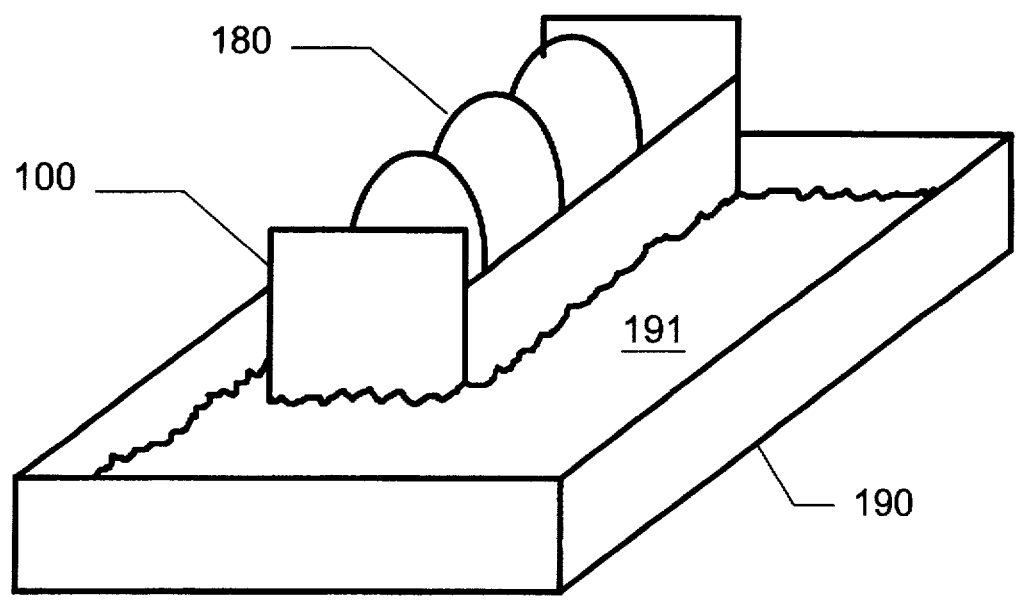
FIG. 1 is a view of a rinse system compatible with the present invention.

FIG. 1 shows a rinse system according to the present invention. A trough 100 holds a plurality of objects 180 to be rinsed. A tank 190 contains a rinse fluid 191. The trough 100 contains means for injecting rinse fluid 191 into the trough 100 through the floor, sides, or ends of the trough 100. The rinse fluid 191 introduced into the trough 100 flows past the objects 180 and then back out of the trough 100 and into the tank 190. The efficiency of the rinse operation depends on the rinse fluid velocity pattern over the surfaces of the objects.

Figure 2:
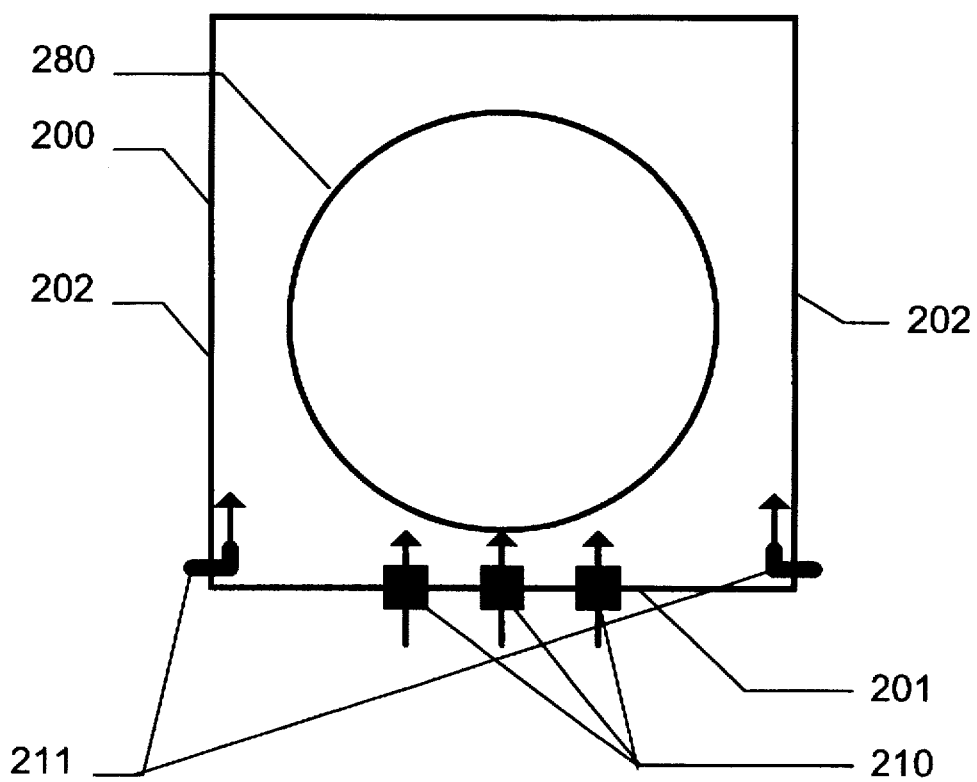
FIG. 2 is a cross-sectional view of a rinse trough according to the present invention.

FIG. 2 is a cross-sectional view of a rinse trough 200 according to the present invention. The trough 200 holds objects 280 to be rinsed. Floor injectors 210, 211 are located with the floor 201 and sides 202 of the trough 200. The floor injectors 210, 211 inject rinse fluid into the trough 200. The floor injectors 210, 211 can direct the rinse fluid flow across the surfaces of the objects 280 so that the rinse fluid velocity pattern is substantially even across the surfaces of the objects 280. The floor injectors 210, 211 allow sufficient rinse fluid into the trough 200 for rinsing. The floor injectors 210, 211 have orientations and flow rates that prevent recirculating flow patterns, fluid flow stagnation, and fluid flow pattern coalescing, all of which can result in uneven rinse fluid flow patterns and consequent uneven rinsing.

Figure 3:
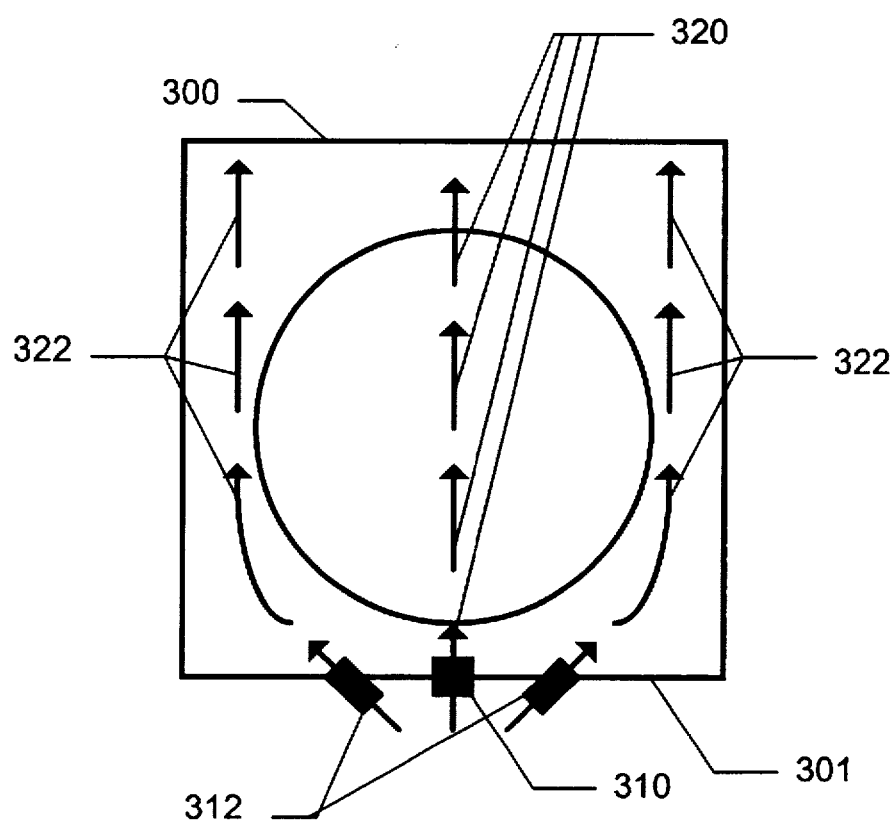
FIG. 3 is a cross-sectional view of a rinse trough according to the present invention.

FIG. 3 is a cross-sectional view of one embodiment of the present invention. A row of central floor injectors, represented by central floor injector 310, mounts with the floor 301 of a trough 300. Central floor injector 310 injects rinse fluid into the trough 300 with rinse fluid velocity as represented by flow line 320. The flow line 320 merely indicates the general flow of rinse fluid rather than any specific rinse fluid flow pattern. Two rows of lateral floor injectors, represented by lateral floor injectors 312, mount with the floor 301 of the trough 300 and flank the central floor injectors. Lateral floor injectors 312 inject rinse fluid into the trough 300 with rinse fluid velocity as represented by flow lines 322. Lateral floor injectors 312 are angled away from central floor injectors 310 so that their respective fluid flows will not coalesce and cause reduced rinse fluid velocity over the regions away from the area of coalescence. Variations on this embodiment include different number and placement of injectors, different injector flow rates, and different relative angled orientations.

Figure 4:
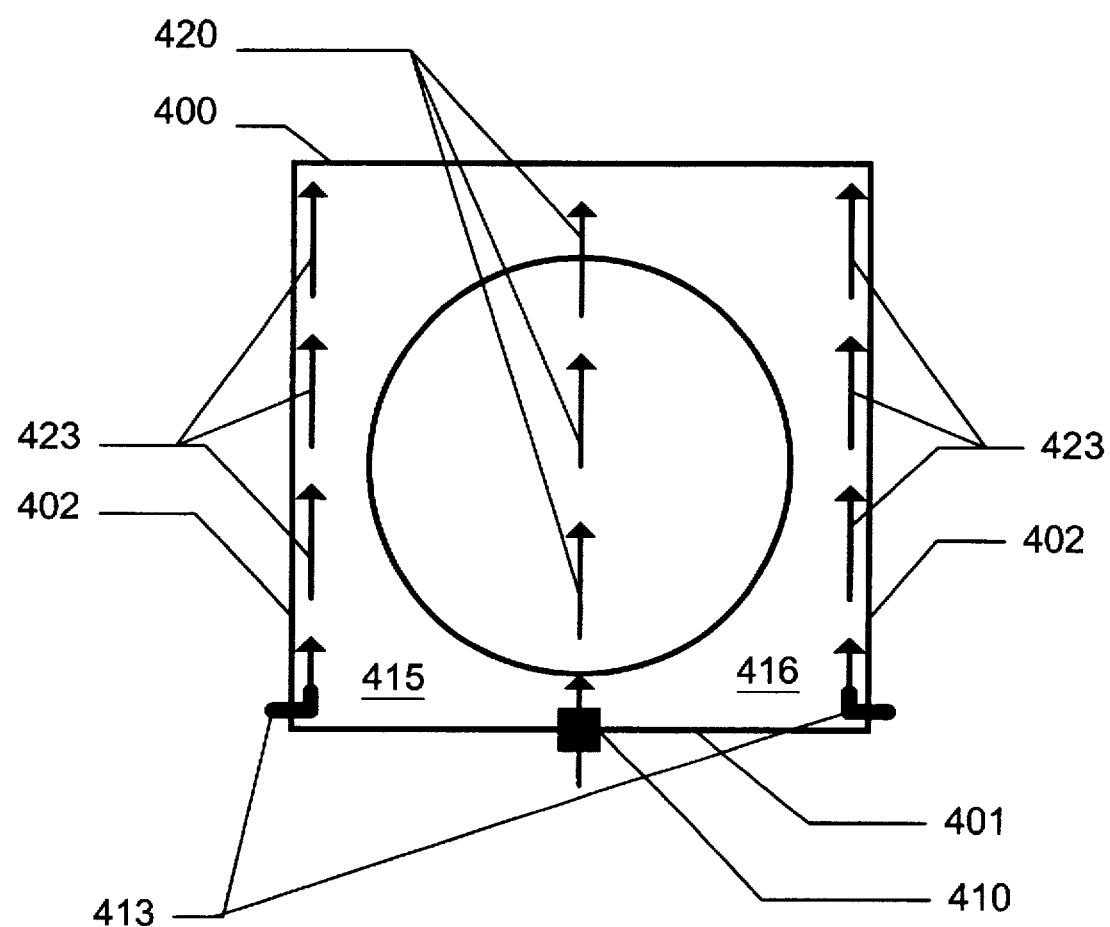
FIG. 4 is a cross-sectional view of a rinse trough according to the present invention.

FIG. 4 is a cross-sectional view of another embodiment of the present invention. A central row of floor injectors, represented by central floor injector 410, mounts with the floor 401 of a trough 400. Central floor injector 410 injects rinse fluid into the trough 400 with fluid velocity as represented by flow line 420. Two rows of side injectors, represented by side injectors 413, mount with the sides 402 of the trough. Side injectors 413 inject rinse fluid into the trough 400 with fluid velocity as represented by flow lines 413. Side injectors 423 direct rinse fluid flow upward so that the fluid flow from central floor injector 410 does not stimulate a recirculating flow pattern or leave stagnant rinse fluid in the lower corners 415, 416 of trough 400. Variations on this embodiment include different numbers and locations of injectors and different injector flow rates.

Figure 5:
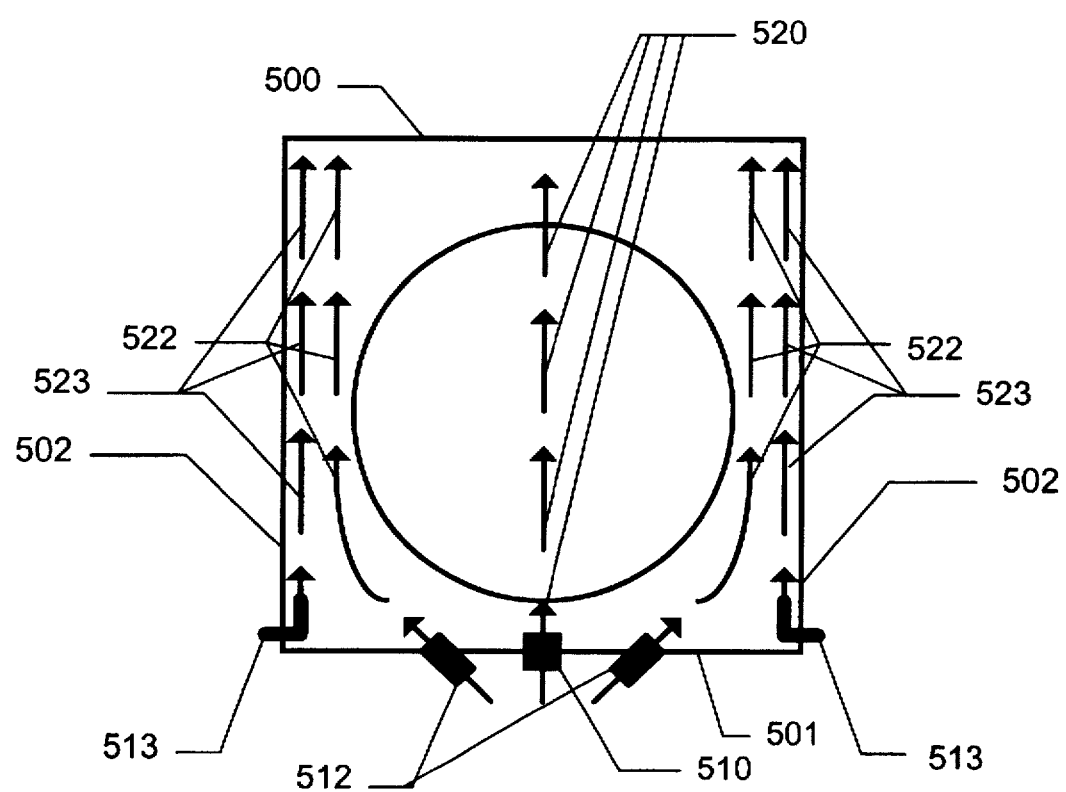
FIG. 5 is a cross-sectional view of a rinse trough according to the present invention.

FIG. 5 is a cross-sectional view of another embodiment of the present invention. A row of central floor injectors, represented by central floor injector 510, mounts with the floor 501 of a trough 500. Central floor injector 510 injects rinse fluid into the trough 500 with rinse fluid velocity as represented by flow line 520. Two rows of lateral floor injectors, represented by lateral floor injectors 512, mount with the floor 501 of the trough 500 and flank the central row of floor injectors 510. Lateral floor injectors 512 inject rinse fluid into the trough 500 with rinse fluid velocity as represented by flow lines 520. Lateral floor injectors 512 are angled away from central floor injector 510 so that their respective fluid flows will not coalesce and cause reduced rinse fluid velocity over the regions away from the area of coalescence. Two rows of side injectors, represented by side injectors 513, mount with the sides 502 of the trough 500. Side injectors 513 inject rinse fluid into the trough 500 with rinse fluid velocity as represented by flow lines 523. Side injectors 513 direct fluid flow upward so that the fluid flow from central floor injector 510 and lateral floor injectors 512 does not stimulate a recirculating flow pattern or leave stagnant rinse fluid in the lower corners 515, 516 of trough 500. Variations on this embodiment include different numbers and placement of injectors, different injector flow rates, and different relative injector orientations.

The embodiment shown in FIG. 5 can be implemented with current rinse systems. Improved fluid flow means according to the present invention can improve the rinsing efficiency and uniformity.

The present invention has been tested and proven useful rinsing a load of 50 semiconductor wafers held vertically in a Teflon rack on the floor of a rinse trough. The particular arrangement of injectors in the test system comprised three rows of floor injectors: one row on the trough centerline oriented vertically upward, and two lateral rows located 3.7 cm off the trough centerline and oriented 22.5° from vertical. The injector arrangement additionally comprised a row of upward directed side injectors mounted with the sides of the trough. Most of the fluid flow was through the floor injectors, but a non-negligible portion was through the side injectors.

Side injectors flow rates from 0% to 48% of the total trough flow rate (side injectors plus floor injectors) were evaluated. Side injection flow rates from 6% to 19% yielded the best rinsing in the test system. Outer injector angles of 0°, 22.5°, and 45° from vertical were evaluated. Angling the outer injectors 22.5° from vertical yielded the best rinsing in the test system. With that outer injector angle, a side injector flow rate of 19% of the total flow rate yielded the best rinsing.

The rinse trough tested was approximately 21 inches long by 11⅜ inches high and was made with Plexiglas walls. Those skilled in the art will appreciate that other inert materials are also suitable for rinse troughs. The floor injectors in the rinse trough tested comprised three rows of 0.188 inch diameter holes through the floor of the trough (a total of 156 holes). The side injectors in the rinse trough tested comprised 16 nylon inserts on each side of the trough, with each insert having a 0.110 inch diameter L-shaped channel therethrough, with a 0.110 inch diameter opening facing upward in the trough.

The particular sizes and equipment discussed above are cited merely to illustrate a particular embodiment of the invention. It is contemplated that the use of the invention may involve components having different sizes and characteristics. It is intended that the scope of the invention be defined by the claims appended hereto.

We claim:

1. A trough for rinsing with a rinse fluid one or more planar objects having substantially the same shape and size comprising:

a) parallel end walls, parallel side walls sealingly connected to the end walls, and a floor sealingly connected to the end walls and to the side walls, and, b) means for holding the objects in the trough;

c) flow means for injecting rinse fluid into the trough with fluid flow that is substantially even across the surfaces of the objects, wherein the flow means comprises a plurality of injectors mounted with the trough oriented relative to each other so that rinse fluid flow is substantially even across the surfaces of the objects, wherein the plurality of injectors comprises:

c1) a plurality of central floor injectors mounted with the floor that inject rinse fluid into the trough directed in a first direction substantially normal to the lower edges of the objects;

c2) a plurality of first injectors mounted with the floor that inject rinse fluid into the trough directed at a first angle to the first direction, and c3) a plurality of second injectors mounted with the floor that inject rinse fluid into the trough directed at a second angle to the first direction.

2. The trough of claim 1 wherein the first angle is greater than 0 degrees and less than 45 degrees away from the first direction.

3. The trough of claim 1 wherein the second angle is greater than 0 degrees and less than 45 degrees away from the first direction.

4. The trough of claim 1 wherein the first angle is greater than 0 degrees and less than 45 degrees away from the first direction, and wherein the second angle is greater than 0 degrees and less than 45 degrees away from the first direction.

5. The trough of claim 1 wherein the first angle is greater than 20 degrees and less than 25 degrees away from the first direction, and wherein the second angle is greater than 20 degrees and less than 25 degrees away from the first direction.

6. A trough for rinsing with a rinse fluid one or more planar objects having substantially the same shape and size comprising:

a) parallel end walls, parallel side walls sealingly connected to the end walls, and a floor sealingly connected to the end walls and to the side walls, and, b) means for holding the objects in the trough;

c) flow means for injecting rinse fluid into the trough with fluid flow that is substantially even across the surfaces of the objects, wherein the flow means comprises a plurality of injectors mounted with the trough oriented relative to each other so that rinse fluid flow is substantially even across the surfaces of the objects, wherein the plurality of injectors comprises first and second floor injector sets mounted with the floor, wherein the injectors in the first injector set inject rinse fluid into the trough directed over the surfaces of the objects along a first direction and the injectors in the second injector set inject rinse fluid into the trough directed across the surfaces of the objects along a second direction at an angle away from the first direction.

7. The trough of claim 6 wherein the angle is greater than 0 degrees and less than 45 degrees away from the first direction.

8. The trough of claim 6 wherein the angle is greater than 15 degrees and less than 30 degrees away from the first direction.

9. A trough for rinsing with a rinse fluid one or more planar objects having substantially the same shape and size comprising:

a) parallel end walls, parallel side walls sealingly connected to the end walls, and a floor sealingly connected to the end walls and to the side walls, and, b) means for holding the objects in the trough;

c) flow means for injecting rinse fluid into the trough with fluid flow that is substantially even across the surfaces of the objects, wherein the flow means comprises a plurality of injectors mounted with the trough oriented relative to each other so that rinse fluid flow is substantially even across the surfaces of the objects, wherein the plurality of injectors comprises a plurality of side injectors mounted with the side walls, directed away from the floor, and a plurality of floor injectors mounted with the floor.

10. The trough of claim 9 wherein the floor injectors inject rinse fluid into the trough at a first flow rate and wherein the side injectors inject rinse fluid into the trough at a second flow rate, and wherein the second flow rate is greater than 5% and less than 20% of the first flow rate.

11. The trough of claim 9 wherein the side injectors and floor injectors inject rinse fluid into the trough directed along directions that are within 45 degrees of parallel to each other.

12. A trough for rinsing with a rinse fluid one or more planar objects having substantially the same shape and size comprising:

a) parallel end walls, parallel side walls sealingly connected to the end walls, and a floor sealingly connected to the end walls and to the side walls, and, b) means for holding the objects in the trough;

c) flow means for injecting rinse fluid into the trough with fluid flow that is substantially even across the surfaces of the objects, wherein the flow means comprises a plurality of injectors mounted with the trough oriented relative to each other so that rinse fluid flow is substantially even across the surfaces of the objects, wherein the plurality of injectors comprises a plurality of side injectors mounted with the side walls and a plurality of floor injectors mounted with the floor, wherein the floor injectors inject rinse fluid into the trough at a first flow rate and wherein the side injectors inject rinse fluid into the trough at a second flow rate, and wherein the second flow rate is greater than 0% and less than 48% of the first flow rate.

13. A trough for rinsing with a rinse fluid a plurality of substantially planar objects, comprising a) parallel end walls;

b) parallel side walls sealingly connected to the end walls;

c) a floor sealingly connected to the end walls and to the side walls;

d) means for holding the objects in the trough along an axis so that the object surfaces are substantially parallel to the end walls;

e) a first plurality of injectors mounted with the floor that inject rinse fluid into the trough directed substantially parallel to the end walls and substantially normal to axis;

f) a second plurality of injectors mounted with the floor that inject rinse fluid into the trough directed substantially parallel to the end walls and at a first angle away from normal to the axis;

g) a third plurality of injectors mounted with the floor that inject rinse fluid into the trough directed substantially parallel to the end walls and at a second angle away from normal to the axis; and h) a plurality of side injectors mounted with the side walls that inject rinse fluid into the trough directed substantially parallel to the end walls and substantial parallel to the side walls.

14. The trough of claim 13 wherein the first and second angles are greater than 0 degrees and less than 45 degrees.

15. The trough of claim 13 wherein the first and second angles are greater than 20 degrees and less than 25 degrees.

16. The trough of claim 13 where the side injectors inject rinse fluid into the trough at a rate that is greater than 0% and less than 48% of the rate fluid enters the trough through the combination of the first, second, and third pluralities of injectors and the side injectors.

17. The trough of claim 14 wherein the side injectors inject rinse fluid into the trough at a rate that is greater than 5% and less than 20% of the rate fluid enters the trough through the combination of the first, second, and third pluralities of injectors and the side injectors.

* * * * *